US009634072B2

(12) United States Patent
You et al.

(10) Patent No.: US 9,634,072 B2
(45) Date of Patent: Apr. 25, 2017

(54) ORGANIC LIGHT-EMITTING DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Chun-Gi You, Yongin-si (KR); Joon-Hoo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 370 days.

(21) Appl. No.: 13/801,530

(22) Filed: Mar. 13, 2013

(65) Prior Publication Data
US 2014/0061607 A1    Mar. 6, 2014

(30) Foreign Application Priority Data

Sep. 6, 2012 (KR) .................. 10-2012-0098959

(51) Int. Cl.
*H01L 33/08* (2010.01)
*H01L 27/32* (2006.01)
*H01L 27/12* (2006.01)

(52) U.S. Cl.
CPC ........ *H01L 27/3258* (2013.01); *H01L 27/124* (2013.01); *H01L 27/1255* (2013.01); *H01L 27/3244* (2013.01); *H01L 27/3248* (2013.01)

(58) Field of Classification Search
CPC ............... H01L 27/3244; H01L 27/124; H01L 27/1255
USPC .................................... 257/40, 59
See application file for complete search history.

(56) References Cited

U.S. PATENT DOCUMENTS

| 8,106,402 | B2 | 1/2012 | Yeo et al. | |
| 2006/0012742 | A1* | 1/2006 | Tsai et al. | 349/139 |
| 2011/0266546 | A1* | 11/2011 | You | 257/59 |
| 2012/0001185 | A1* | 1/2012 | Lee et al. | 257/59 |
| 2013/0146878 | A1* | 6/2013 | Oh et al. | 257/59 |

FOREIGN PATENT DOCUMENTS

| KR | 10-2009-0120698 A | 11/2009 |
| KR | 10-2010-0070082 A | 6/2010 |
| KR | 10-2010-0088269 | 8/2010 |
| KR | 10-2011-0070607 A | 6/2011 |

* cited by examiner

*Primary Examiner* — Marc Armand
*Assistant Examiner* — Tifney Skyles
(74) *Attorney, Agent, or Firm* — Lewis Roca Rothgerber Christie LLP

(57) ABSTRACT

An organic light-emitting display device includes: a substrate; an active layer on the substrate; a gate electrode insulated from the active layer and overlapping with the active layer; a source electrode including a first source electrode layer, connected to the active layer, and a second source electrode layer connected to the first source electrode layer, the second source electrode layer being larger than the first source electrode layer; a drain electrode including a first drain electrode layer connected to the active layer, and a second drain electrode layer connected to the first drain electrode layer, the second drain electrode layer being larger than the first drain electrode layer; a first electrode directly connected to a top surface of the source electrode or the drain electrode; an intermediate layer on the first electrode and including an organic emission layer; and a second electrode on the intermediate layer.

16 Claims, 5 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0098959, filed in the Korean Intellectual Property Office on Sep. 6, 2012, the entire contents of which are incorporated herein by reference.

BACKGROUND

1. Field

One or more embodiments of the present invention relate to an organic light-emitting display device and a method of manufacturing the same.

2. Description of the Related Art

Display devices are being replaced with flat display devices that are portable and thin. Among flat display devices, organic light-emitting display devices have drawn attention as next generation display devices because they are self light-emitting and have superior characteristics, such as wide viewing angles, high contrast ratios, and short response times.

An organic light-emitting display device includes an intermediate layer, a first electrode, and a second electrode. The intermediate layer includes an organic emission layer, and when voltages are applied to the first and second electrodes, visible light is emitted from the organic emission layer.

The organic light-emitting display device may further include a thin film transistor for operating the organic light-emitting display device. The thin film transistor includes an active layer, a gate electrode, a source electrode, and a drain electrode.

In this case, when the thin film transistor is formed, an insulating layer is disposed between thin layers of the thin film transistor. For example, an insulating layer may be disposed between the source and gate electrodes and between the drain and gate electrodes.

When the insulating layer is formed, a short-circuit may occur between elements to be insulated by the insulating layer, such as between the gate electrode and the source electrode or between the gate electrode and the drain electrode. The short circuits may be the result of particles penetrating the insulating layer or morphology of elements formed under the insulating layer, such as the gate electrode. In particular, when an organic light-emitting display device having high resolution is manufactured, a line width of wirings and a distance between wirings are decreased. Thus, the above defects occur frequently, and there is a limitation in improving a display quality of the organic light-emitting display device.

SUMMARY

Aspects of embodiments of the present invention are directed to an organic light-emitting display device that has an increased aperture ratio and improved display quality, and a method of manufacturing the same.

According to aspects of the present invention, an organic light-emitting display device includes: a substrate; an active layer on the substrate; a gate electrode insulated from the active layer and overlapping the active layer; a source electrode; a drain electrode; a first electrode that is directly connected to a top surface of the source electrode or the drain electrode; and a second electrode on the intermediate layer. The source electrode includes a first source electrode layer connected to the active layer, and a second source electrode layer connected to the first source electrode layer, the second source electrode layer being larger than the first source electrode layer. The drain electrode includes a first drain electrode layer connected to the active layer, and a second drain electrode layer connected to the first drain electrode layer, the second drain electrode layer being larger than the first drain electrode layer.

The organic light-emitting display device may further include a first interlayer insulating layer on the gate electrode and having a first contact opening; and a second interlayer insulating layer on the first interlayer insulating layer and having a second contact opening.

The first source electrode layer and the first drain electrode layer may correspond to the first contact opening, and the second source electrode layer and the second drain electrode layer may correspond to the second contact opening.

The first contact opening may be smaller than the second contact opening.

A plurality of first contact openings may be connected to one second contact opening.

The first interlayer insulating layer may include an inorganic material, and the second interlayer insulating layer may include an organic material.

A top surface of the second interlayer insulating layer may have a planarized surface.

The first electrode may be in an opening in the second interlayer insulating layer, and the first electrode may be connected to the source electrode or the drain electrode along a side surface of the opening.

The first electrode may be between the substrate and the gate electrode.

The opening in the second interlayer insulating layer may be at an inner side of an opening in the first interlayer insulating layer.

A gate insulating layer may be between the active layer and the gate electrode, and an opening in the gate insulating layer and an opening in the first interlayer insulating layer may have the same etched surface.

The first electrode may include at least one of indium tin oxide (ITO), indium zinc oxide (IZO), zinc oxide (ZnO), $In_2O_3$, indium gallium oxide (IGO), or Al-doped zinc oxide (AZO).

The first electrode further may include a semi-permeable metal layer.

The second electrode may be a reflective electrode.

The substrate may include a capacitor area where at least one capacitor including a first capacitor electrode and a second capacitor electrode is located.

The first capacitor electrode and the active layer may be in the same layer, and the second capacitor electrode and the gate electrode may be in the same layer.

According to another aspect of the present invention, a method of manufacturing an organic light-emitting display device includes: forming an active layer on a substrate; forming a gate electrode that is insulated from the active layer and overlaps with the active layer; forming a source electrode including a first source electrode layer connected to the active layer, and a second source electrode layer connected to the first source electrode layer, the second source electrode layer being formed to be larger than the first source electrode layer; forming a drain electrode including a first drain electrode layer connected to the active layer, and a second drain electrode layer connected to the first drain electrode layer, the second drain electrode layer being formed to be larger than the first drain electrode layer; forming a first electrode to be directly connected to a top surface of the source electrode or the drain electrode; forming an intermediate layer on the first electrode that includes an organic emission layer; and forming a second electrode on the intermediate layer.

The method may further include forming a first interlayer insulating layer on the gate electrode, wherein the first interlayer insulating layer has a first contact opening; and forming a second interlayer insulating layer on the first interlayer insulating layer, wherein the second interlayer insulating layer may have a second contact opening.

The forming of the source electrode and the forming of the drain electrode may include forming the first source electrode layer and the first drain electrode layer to correspond to the first contact opening and forming the second source electrode layer and the second drain electrode layer to correspond to the second contact opening.

The forming of the source electrode and the forming of the drain electrode may include forming the first source electrode layer, the first drain electrode layer, the second source electrode layer, and the second drain electrode layer in one process after forming the first interlayer insulating layer and the second interlayer insulating layer.

The forming of the second interlayer insulating layer may include forming an opening in the second interlayer insulating layer, and the first electrode may be in the opening.

The forming of the first electrode may include forming the first electrode to be connected to a top surface of the source electrode or the drain electrode along a side surface of the opening formed in the second interlayer insulating layer.

The forming of the first interlayer insulating layer may include forming an opening in the first interlayer insulating layer, and the forming of the second interlayer insulating layer may include forming an opening in the second interlayer insulating layer, the opening in the second interlayer insulating layer being smaller than the opening formed in the first interlayer insulating layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
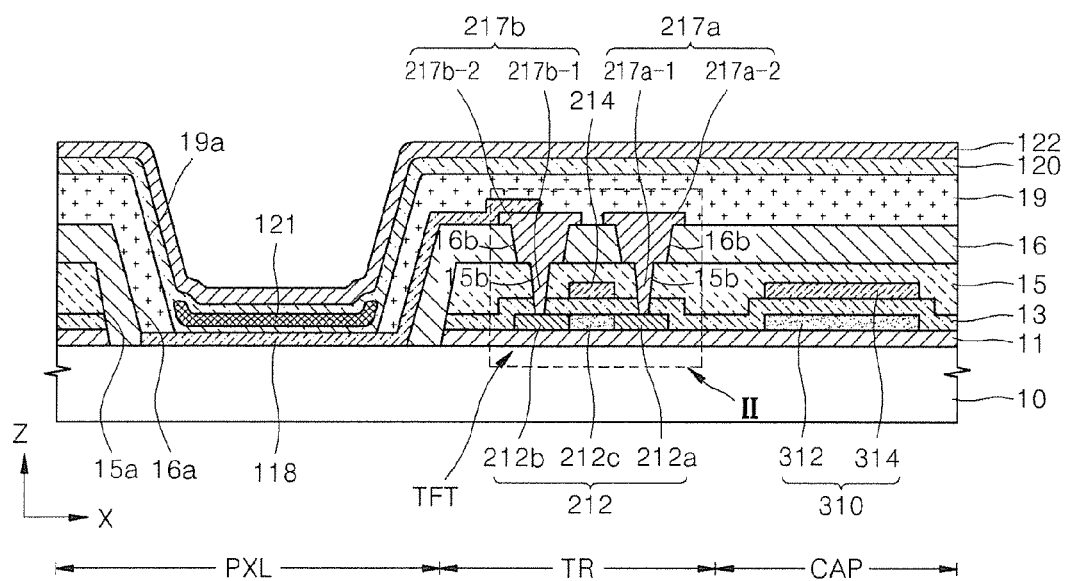
FIG. 1 is a schematic cross-sectional view of an organic light-emitting display device according to an embodiment of the present invention.

The present invention will now be described more fully with reference to the accompanying drawings, in which exemplary embodiments of the invention are shown.

The invention may, however, be embodied in many different forms, and should not be construed as being limited to the embodiments set forth herein; rather, these embodiments are provided so that this disclosure will be thorough and complete, and will fully convey the concept of the invention to one of ordinary skill in the art.

In the drawings, the thicknesses of layers and areas may be exaggerated for clarity. Like reference numerals denote like elements throughout the specification. Throughout the specification, it will also be understood that when an element such as layer, area, or substrate is referred to as being "on" another element, it can be directly on the other element, or intervening elements may also be present. In addition, relative terms such as "lower" or "bottom", and "upper" or "top" may be used herein to describe one element's relationship to another as illustrated in the drawings. It will be understood that relative terms are intended to encompass different orientations of the device in addition to the orientation depicted in the drawings. For example, if a device in the drawings is inverted, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if a device in one of the drawings is inverted, elements described as "below" or "beneath" other elements would then be oriented "above" the other elements. The exemplary terms "below" or "beneath" can, therefore, encompass both an orientation of above and below. As used herein, the term "and/or" includes any and all combinations of one or more of the associated listed items. Expressions such as "at least one of," when preceding a list of elements, may modify the entire list of elements and does not necessarily modify the individual elements of the list.

Also, the accompanying drawings show an active matrix (AM) organic light-emitting diode (AMOLED) display device having a 2Tr-1Cap structure which includes two thin film transistors (TFTs) and one capacitor in one pixel, and an AMOLED display device having a 6Tr-2Cap structure which includes six TFTs and two capacitors, but the present invention is not limited thereto. Thus, an organic light-emitting display device may include a plurality of TFTs and at least one capacitor in one pixel, and may be formed to have any of various structures by further forming an additional wiring or by omitting the existing wiring. Here, the pixel is the smallest unit that displays a portion of an image, and an organic light-emitting display device displays an image through a plurality of pixels.

FIG. 1 is a schematic cross-sectional view of an organic light-emitting display device according to an embodiment of the present invention.

Referring to FIG. 1, the organic light-emitting display device according to the present embodiment includes a substrate 10, a buffer layer 11, a first electrode 118, a thin film transistor TFT, an intermediate layer 120, a second electrode 122, a first interlayer insulating layer 15, a second interlayer insulating layer 16, and a capacitor 310.

The substrate 10 is defined by a plurality of areas, which includes a pixel area PXL, a transistor area TR, and a capacitor area CAP.

The pixel area PXL is an area in which at least the intermediate layer 120 is included and in which visible light is emitted from the intermediate layer 120. The transistor area TR is an area in which various electrical signals for performing an operation in the emission area PXL are transmitted and where the thin film transistor TFT is disposed.

The thin film transistor TFT includes an active layer 212, a gate electrode 214, a source electrode 217a, and a drain electrode 217b. In addition, the source electrode 217a includes a first source electrode layer 217a-1 and a second source electrode layer 217a-2, and the drain electrode 217b includes a first drain electrode layer 217b-1 and a second drain electrode layer 217b-2.

The capacitor 310 is disposed in the capacitor area CAP and includes a first capacitor electrode 312 and a second capacitor electrode 314.

The configuration of elements will now be described in more detail.

The substrate 10 may be formed of a transparent glass material containing $SiO_2$ as a main component. However, embodiments of the present invention are not limited thereto, and the substrate 10 may also be formed of a transparent plastic material. In this case, the transparent plastic material for forming the substrate 10 may be at least one selected from various known organic materials. However, any suitable substrate material may be used.

The buffer layer 11 is formed on the substrate 10. The buffer layer 11 prevents impurity elements from penetrating into the substrate 10 (or reduces the amount of impurities penetrating into the substrate 10) and planarizes an upper portion of the substrate 10. Thus, the buffer layer 11 may be formed of various materials that serve such functions. For example, the buffer layer 11 may include an inorganic material, such as silicon oxide, silicon nitride, silicon oxynitride, aluminum oxide, aluminum nitride, titanium oxide, and/or titanium nitride, or an organic material, such as polyimide, polyester, and/or acryl. The buffer layer 11 may have a stack structure in which a plurality of the materials are deposited. Also, the buffer layer 11 may be omitted according to process conditions.

The active layer 212 and the first capacitor electrode 312 are formed on the buffer layer 11. The active layer 212 and the first capacitor electrode 312 may be formed of the same material. The active layer 212 and the first capacitor electrode 312 may include a semiconductor material, for example, silicon. The active layer 212 may include a source area 212a, a drain area 212b, and a channel layer 212c which is disposed between the source area 212a and the drain area 212b.

A gate insulating layer 13 is formed on the buffer layer 11 to cover the active layer 212 and the first capacitor electrode 312.

The gate electrode 214 and the second capacitor electrode 314 are formed on the gate insulating layer 13.

The gate electrode 214 may be formed with a metal or a metal alloy such as Mo, MoW, or an Al-based alloy. However, embodiments of the present invention are not limited thereto, and the gate electrode 214 may also include a stack (i.e., layered) structure of Mo/Al/Mo.

The second capacitor electrode 314 may be formed of the same material as the gate electrode 214.

The first interlayer insulating layer 15 is formed on the gate electrode 214 and the second capacitor electrode 314. The first interlayer insulating layer 15 may include various insulating materials, for example, inorganic materials.

The first interlayer insulating layer 15 includes first contact holes 15b (e.g., first contact openings) exposing the TFT.

Also, an opening 15a is formed in the first interlayer insulating layer 15, wherein the opening 15a and an opening in the gate insulating layer 13 have the same etched surface. The first interlayer insulating layer 15 is formed so that it does not cover a top surface of the first electrode 118.

The first source electrode layer 217a-1 of the source electrode 217a and the first drain electrode layer 217b-1 of the drain electrode 217b are formed to correspond to the first contact holes 15b of the first interlayer insulating layer 15.

The first source electrode layer 217a-1 and the first drain electrode layer 217b-1 are formed to be connected to the active layer 212 of the TFT. The first source electrode layer 217a-1 and the first drain electrode layer 217b-1 may be formed using various materials. For example, the first source electrode layer 217a-1 and the first drain electrode layer 217b-1 may be formed of metal, such as Au, Pd, Pt, Ni, Rh, Ru, Ir, Os, Al, Mo, Nd, Mo, or W, or may be formed of an alloy including two or more of these materials. However, embodiments of the present invention are not limited thereto.

The second interlayer insulating layer 16 is formed on the first interlayer insulating layer 15. The second interlayer insulating layer 16 may be formed of various insulating materials, for example, organic materials.

The second interlayer insulating layer 16 includes second contact holes 16b (e.g., second contact openings).

Also, an opening 16a is formed in the second interlayer insulating layer 16 at an inner side of the opening 15a formed in first interlayer insulating layer 15. The opening 16a is formed so that it does not cover a top surface of the first electrode 118.

The second source electrode layer 217a-2 of the source electrode 217a and the second drain electrode layer 217b-2 of the drain electrode 217b are formed to correspond to the second contact hole 16b of the second interlayer insulating layer 16.

The second source electrode layer 217a-2 and the second drain electrode layer 217b-2 are formed to be connected to the first source electrode layer 217a-1 and the first drain electrode layer 217b-1, respectively. The second source electrode layer 217a-2 and the second drain electrode layer 217b-2 may be formed using various materials, for example, a metal such as Au, Pd, Pt, Ni, Rh, Ru, Ir, Os, Al, Mo, Nd, Mo, or W, or may be formed of an alloy including two or more of the materials. However, embodiments of the present invention are not limited thereto.

Figure 2:
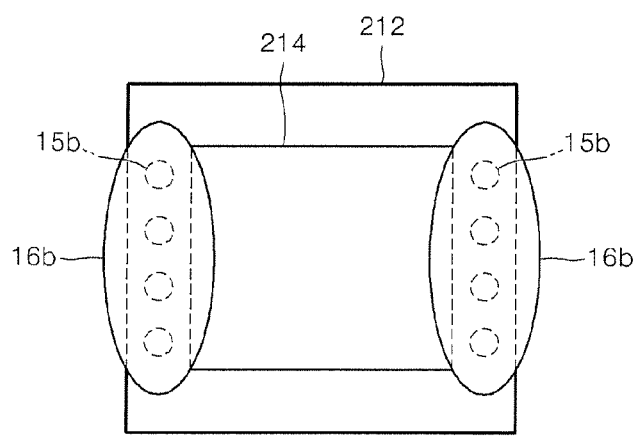
FIG. 2 is a plan view of portion II of FIG. 1 in detail.

The first source electrode layer 217a-1 of the source electrode 217a is formed smaller than the second source electrode layer 217a-2. In detail, a first contact hole 15b of the first interlayer insulating layer 15 is formed smaller than the second contact hole 16b of the second interlayer insulating layer 16, the first source electrode layer 217a-1 is formed to correspond to the first contact hole 15b, and the second source electrode layer 217a-2 is formed to correspond to the second contact hole 16b. Also, as shown in FIG. 2, a plurality of the first contact holes 15b are formed to be connected to one second contact hole 16b so that a plurality of the first source electrode layers 217a-1 are formed to be connected to one second source electrode layer 217a-2. For example, as shown in FIG. 2, four first contact holes 15b may be connected to one second contact hole 16b.

The first drain electrode layer 217b-1 of the drain electrode 217b is formed smaller than the second drain electrode layer 217b-2. In detail, a first contact hole 15b of the first interlayer insulating layer 15 is formed smaller than the second contact hole 16b of the second interlayer insulating layer 16, and the first drain electrode layer 217b-1 is formed to correspond to the first contact hole 15b, and the second drain electrode layer 217b-2 is formed to correspond to the second contact hole 16b of the second interlayer insulating layer 16. Also, as illustrated in FIG. 2, a plurality of the first contact holes 15b are formed to be connected to one second contact hole 16b so that a plurality of the first drain electrode layers 217b-1 are formed to be connected to the second drain electrode layer 217b-2. For example, as shown in FIG. 2, one second contact hole 16b may be connected to four first contact holes 15b.

Consequently, in the current embodiment, two insulating layers, namely, the first and second interlayer insulating layers 15 and 16, are formed between the gate electrode 214, the second source electrode layer 217a-2, and the second drain electrode layer 217b-2. Accordingly, foreign substances are effectively prevented (e.g., substantially prevented) from being migrating between the gate electrode 214, the second source electrode layer 217a-2, and the second drain electrode layer 217b-2, and/or a short-circuit may be effectively prevented from occurring between the gate electrode 214, the second source electrode layer 217a-2, and the second drain electrode layer 217b-2 as a result of metal components that remain in the gate electrode 214, the second source electrode layer 217a-2, or the second drain electrode layer 217b-2 during formation.

In particular, the first interlayer insulating layer 15, containing an inorganic material that is capable of preventing moisture penetration and also provides good step coverage characteristics, is first formed on the gate electrode 214 so that the gate electrode 214 may be effectively insulated. Also, because the second interlayer insulating layer 16 is formed on the first layer insulating layer 15 by using an organic material, the second layer insulating layer 16 may be easily formed to a desired thickness, and a top surface of the second layer insulating layer 16 is planarized so that the second layer insulating layer 16 may easily function as a planarization layer. Also, a gate wiring of the gate electrode 214 may be formed to be thick so that an increase in resistance due to a reduction in a width of the gate wiring may be reduced or prevented, thereby preventing or reducing a delay in signal transmission.

In this case, the first contact hole 15b of the first interlayer insulating layer 15 is formed to have a small size so that a distance between the source electrode 217a and the drain electrode 217b and a distance between other wirings may be minimized, thereby enabling an organic light-emitting display device having high resolution. In addition, the second contact hole 16b of the second layer insulating layer 16 is formed larger than the first contact hole 15b so that electrical characteristics of the thin film transistor TFT may be improved. In particular, a plurality of the first contact holes 15b are formed to be connected to one second contact hole 16b so that an electrical contact characteristic between the first source electrode layer 217a-1 and the active layer 212 and an electrical contact characteristic between the first drain electrode layer 217b-1 and the active layer 212 may be improved.

One of the source electrode 217a and the drain electrode 217b is electrically connected to the first electrode 118. FIG. 1 illustrates that the second drain electrode layer 217b-2 of the drain electrode 217b is electrically connected to the first electrode 118. In detail, the first electrode 118 directly contacts a top surface of the second drain electrode layer 217b-2 of the drain electrode 217b. Furthermore, the first electrode 118 is formed at a bottom surface of the opening 16a formed in the second interlayer insulating layer 16 and along a side surface of the opening 16a of the second interlayer insulating layer 16. In other words, the first electrode 118 and the drain electrode 217b are not connected to each other via a contact hole. Thus, because the design margin (e.g. size) of the contact hole may be reduced, the design margin (e.g. size) of the first electrode 118 may be increased, thereby improving an aperture ratio compared to conventional devices.

In the current embodiment, the first electrode 118 is formed in a separate mask process than the mask process for forming other conductive layers, such as the mask process for forming the gate electrode 214 and the second capacitor electrode 314. Thus, the degree of freedom of selecting a material of the first electrode 118 is high. For example, in a bottom emission type display, in which an image is displayed toward the substrate 10, the first electrode 118 is formed of a transparent electrode including a transparent conductive material such as indium tin oxide (ITO), indium zinc oxide (IZO), zinc oxide (ZnO), $In_2O_3$, indium gallium oxide (IGO), or Al-doped zinc oxide (AZO). Here, because the first electrode 118 is not etched in a process of forming the gate electrode 214 or the second capacitor electrode 314, which generally includes a low-resistive metal, an etching speed may be increased.

The first electrode 118 may be used as a transparent electrode, and at the same time, the first electrode 118 may be formed to further include a semi-permeable metal layer containing silver (Ag) and thus may function as a semi-permeable mirror so that the first electrode 118 and the second electrode 122, which is a reflective electrode, may form a resonance structure. It is difficult to form the semi-permeable metal layer containing Ag together with another low-resistive metal in the same etching process without causing damage. Thus, in the current embodiment, the first electrode 118 is formed in a separate process from the process for forming the other conductive layers so as to protect the first electrode 118 from such damage.

A pixel-defining layer 19 is formed on the first electrode 118 to cover the second source electrode layer 217a-2 of the source electrode 217a and the second drain electrode layer 217b-2 of the drain electrode 217b. An opening 19a is formed in the pixel-defining layer 19 so that at least a portion of the area of the top surface of the first electrode 118 is not covered.

The intermediate layer 120 is formed on the first electrode 118. The intermediate layer 120 includes an organic emission layer 121 so as to emit visible light.

The intermediate layer 120 may be a low-molecular weight organic layer or a polymer organic layer.

When the intermediate layer 120 is formed of a low-molecular weight organic layer, the intermediate layer 120 may include a hole injection layer (HIL), a hole transport layer (HTL), an organic emission layer, an electron transport layer (ETL), and an electron injection layer (EIL).

The HIL may be formed of a phthalocyanine compound, such as copper phthalocyanine (CuPc) or a star-burst type amine such as TCTA, m-MTDATA, or m-MTDAPB.

The HTL may be formed of N,N'-bis(3-methylphenyl)-N,N'-diphenyl [1,1-biphenyl]-4,4'-diamine (TPD), N,N'-di(naphthalene-1-yl)-N,N'-diphenyl-benzidine (α-NPD), and/or the like.

The EIL may be formed of LiF, NaCl, CsF, $Li_2O$, BaO, and/or Liq.

The ETL may be formed using tris-8-hydroxyquinoline aluminum (Alq3).

The organic emission layer may include a host material and a dopant material.

The second electrode 122 is formed on the intermediate layer 120. The second electrode 122 may be formed of a metal, such as Ag, Mg, Al, Pt, Pd, Au, Ni, Nd, Ir, Cr, Li, and/or Ca. In addition, the second electrode 122 may include a light transmitting material such as ITO, IZO, ZnO, and/or $In_2O_3$.

Although not shown, an encapsulation member may be formed on the second electrode 122. The encapsulation member may be formed of an organic and/or inorganic material.

As described above, in the organic light-emitting display device according to the current embodiment, two insulating layers, namely, the first and second interlayer insulating layers 15 and 16, are formed between the gate electrode 214, the source electrode 217*b*, and the drain electrode 217*a* so to effectively prevent a short-circuit from occurring between the gate electrode 214, the source electrode 217*b*, and the drain electrode 217*a*, thereby improving a display quality. Also, a gate wiring of the gate electrode 214 may be formed to be thick so that an increase in resistance due to a reduction in a width of the gate wiring may be reduced or prevented, thereby preventing or reducing a delay in signal transmission.

In this case, the first contact hole 15*b* of the first layer insulating layer 15 is formed to have a small size so that a distance between the gate electrode 214, the source electrode 217*a*, and the drain electrode 217*b* is minimized or reduced so as to easily implement (e.g., enable) an organic light-emitting display device having high resolution. In addition, the second contact hole 16*b* of the second layer insulating layer 16 is formed to be larger than the first contact hole 15*b* so that the electrical characteristics of the thin film transistor TFT may be improved.

The first electrode 118 directly contacts a top surface of the drain electrode 217*b* (i.e. not via a contact hole) so that a design margin for forming the contact hole is reduced (e.g., the size of the contact hole may be reduced), thereby improving an aperture ratio. Also, the first electrode 118 is formed by using a separate etching process than the process for forming other conductive layers, and thus, the degree of freedom of selecting a material of the first electrode 118 is increased.

FIGS. 3A through 3G are schematic cross-sectional views sequentially illustrating a method of manufacturing an organic light-emitting display device according to an embodiment of the present invention.

In detail, FIGS. 3A through 3G illustrate an embodiment of a method of manufacturing the organic light-emitting display device of FIG. 1. For convenience of explanation, only differences between FIGS. 1 and 2 and FIGS. 3A through 3G may be described below.

Figure 3A:
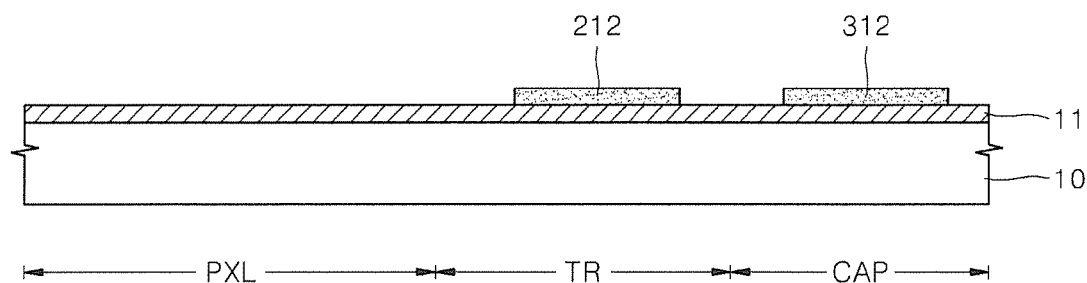
FIGS. 3A through 3G are schematic cross-sectional views sequentially illustrating a method of manufacturing an organic light-emitting display device, according to an embodiment of the present invention.

Referring to FIG. 3A, the substrate 10 is prepared. The buffer layer 11 is formed on the substrate 10. The active layer 212 and the first capacitor electrode 312 are formed on the buffer layer 11. The first capacitor electrode 312 and the active layer 212 may be formed of the same material. Here, the active layer 212 and the first capacitor electrode 312 may be concurrently (e.g., simultaneously) formed (e.g., formed in the same process) by performing a patterning process using one mask.

Figure 3B:
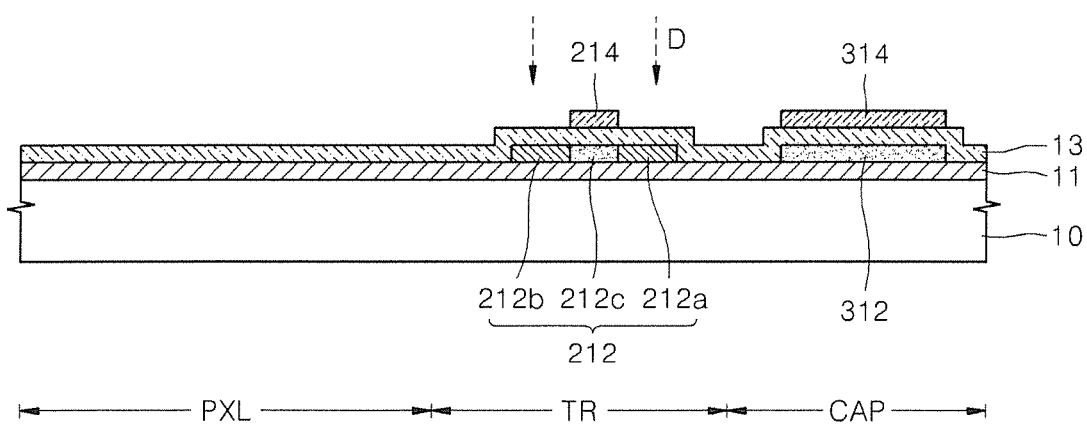

Referring to FIG. 3B, the gate insulating layer 13 is formed to cover the active layer 212 and the first capacitor electrode 312, and the gate electrode 214 and the second capacitor electrode 314 are formed on the gate insulating layer 13. The gate electrode 214 and the second capacitor electrode 314 may be formed by performing a patterning process using one mask, as with the formation of the active layer 212 and the first capacitor electrode 312. Here, a doping process D for doping the source area 212*a* and the drain area 212*b* of the thin film transistor TFT with ion impurities may be performed by using the gate electrode 214 as a self-aligned mask.

Figure 3C:
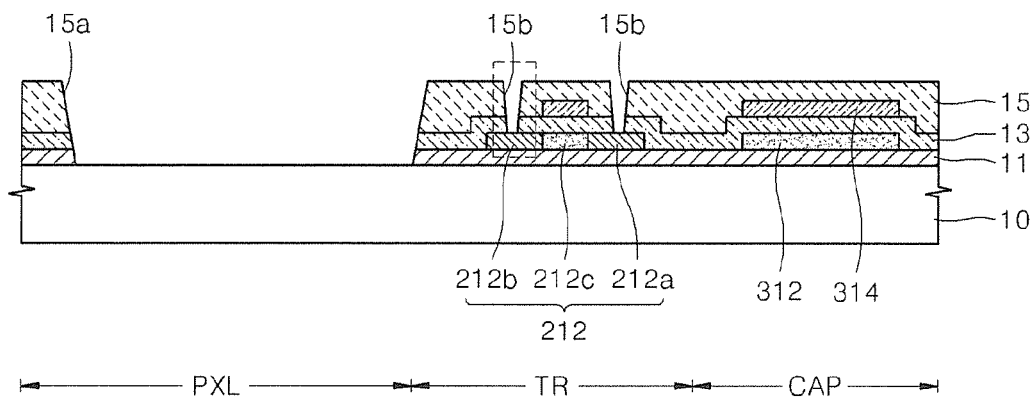

Referring to FIG. 3C, the first interlayer insulating layer 15 is formed on the gate electrode 214 and the second capacitor electrode 314. The first contact holes 15*b* are formed in the first interlayer insulating layer 15 to partially expose a top surface of the active layer 212 (i.e., a portion of drain area 212*b* and source area 212*a*). Although not shown in FIG. 3C, a plurality of the first contact holes 15*b* are formed to correspond to the active layer 212 in any one area about the gate electrode 214, as shown in FIG. 2.

Also, the opening 15*a* in which the first electrode 118 is to be disposed is formed in the first interlayer insulating layer 15. When the opening 15*a* is formed in the first interlayer insulating layer 15, the gate insulating layer 13, which is adjacent to the first interlayer insulating layer 15, and/or the buffer layer 11 may also be concurrently (e.g., simultaneously) etched.

Figure 3D:
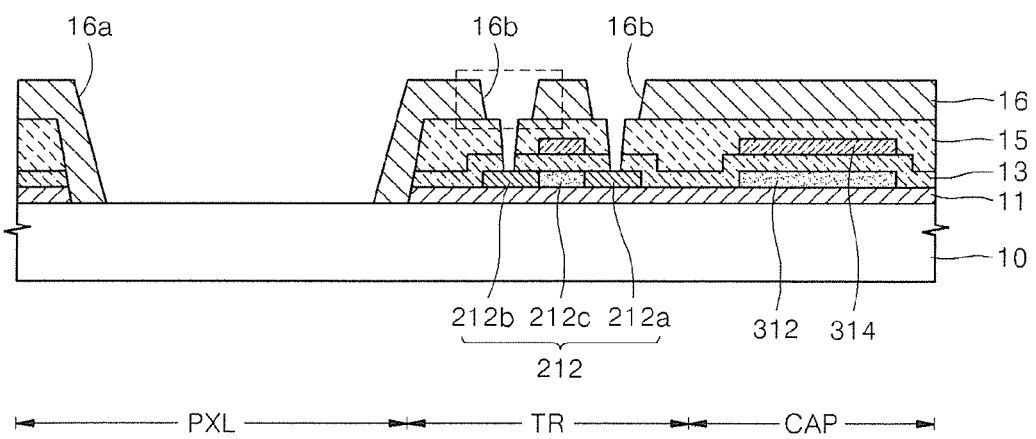

Referring to FIG. 3D, the second interlayer insulating layer 16 is formed on the first interlayer insulating layer 15. The second interlayer insulating layer 16 includes the second contact hole 16*b* in communication with (e.g., connected to) the first contact hole 15*b*. The second contact hole 16*b* is formed to be larger than the first contact hole 15*b*. In particular, when the first interlayer insulating layer 15 is formed of an inorganic material and the second interlayer insulating layer 16 is formed of an organic material, the first contact hole 15*b* may be easily formed to have a small and uniform size, and the second contact hole 16*b* may be easily formed to have a large size.

Also, the opening 16*a* in which the first electrode 118 is disposed is formed in the second interlayer insulating layer 16. The opening 16*a* formed in the second interlayer insulating layer 16 is formed at an inner side of the opening 15*a* formed in the first interlayer insulating layer 15. Accordingly, because the first interlayer insulating layer 15 and the second interlayer insulating layer 16 are formed in different processes, etched surfaces of the opening 15*a* formed in the first interlayer insulating layer 15 and the opening 16*a* formed in the second interlayer insulating layer 16 are spaced apart from each other.

Figure 3E:
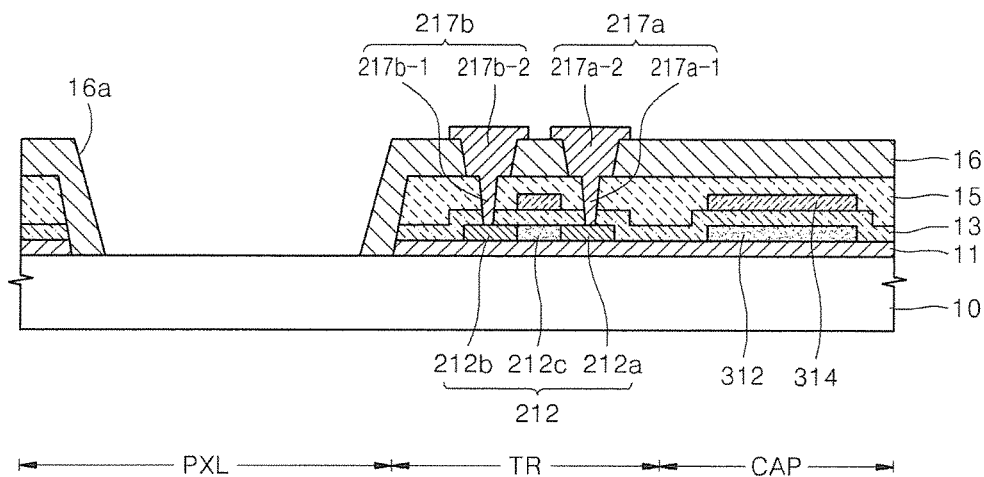

Referring to FIG. 3E, the source electrode 217*a* and the drain electrode 217*b* are formed. In detail, the first source electrode layer 217*a*-1 of the source electrode 217*a* and the first drain electrode layer 217*b*-1 of the drain electrode 217*b* are formed to correspond to respective first contact holes 15*b* of the first interlayer insulating layer 15, and the second source electrode layer 217*a*-2 of the source electrode 217*a* and the second drain electrode layer 217*b*-2 of the drain electrode 217*b* are formed to correspond to respective second contact holes 16*b* of the second interlayer insulating layer 16. Here, the first source electrode layer 217*a*-1, the first drain electrode layer 217*b*-1, the second source electrode layer 217*a*-2, and the second drain electrode layer 217*b*-2 may be concurrently (e.g., simultaneously) formed (e.g., formed during a single process) by using a patterning process using one mask.

Thus, the first source electrode layer 217*a*-1 and the first drain electrode layer 217*b*-1 are formed to be smaller than the second source electrode layer 217*a*-2 and the second drain electrode layer 217*b*-2, respectively. Also, a plurality of the first source electrode layers 217*a*-1 are connected to one second source electrode layer 217*a*-2, and a plurality of the first drain electrode layers 217*b*-1 are connected to one second drain electrode layer 217*b*-2.

Figure 3F:
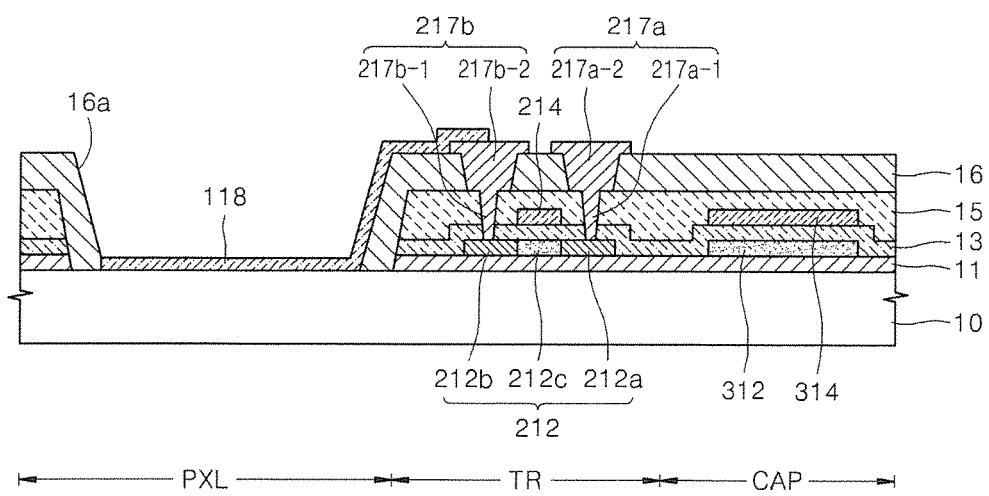

Referring to FIG. 3F, the first electrode 118 is formed to be connected to one of the source electrode 217*a* or the drain electrode 217*b*. The first electrode 118 is formed in the opening 16*a* formed in the second interlayer insulating layer 16. Here, the first electrode 118 is formed along a side surface of the opening 16a in the second interlayer insulating layer 16 and directly contacts a top surface of one of the source electrode 217a or the drain electrode 217b directly, and does not contact one of the source electrode 217a or the drain electrode 217b via a contact hole (or via hole) formed in the first interlayer insulating layer 15 and/or the second interlayer insulating layer 16. Accordingly, because the contact hole (or via hole) is not separately formed, a design margin for forming the contact hole may be reduced (e.g., a size of the contact hole may be reduced), thereby improving an aperture ratio.

Figure 3G:
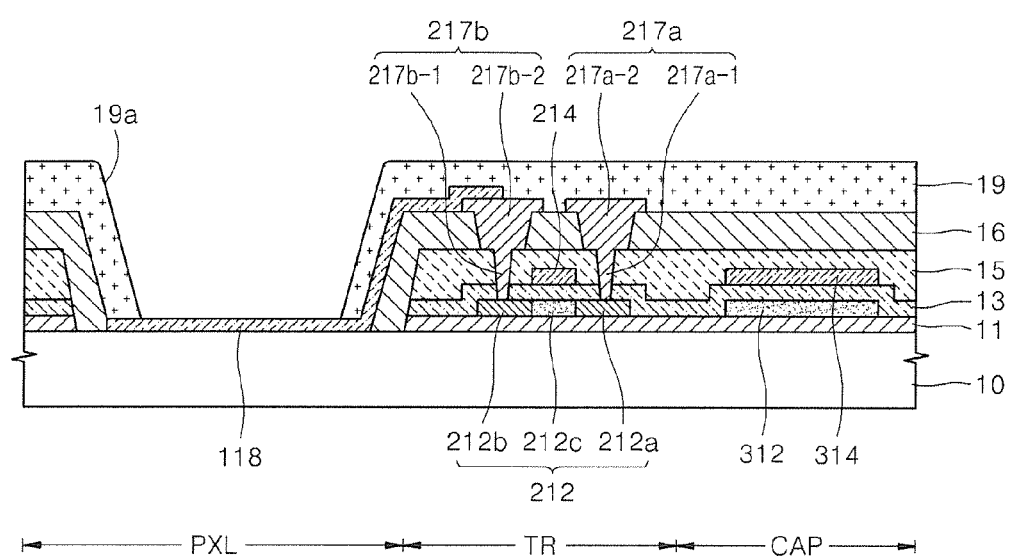

Referring to FIG. 3G, the pixel-defining layer 19 is formed on the second interlayer insulating layer 16 to cover the second source electrode layer 217a-2 and the second drain electrode layer 217b-2. The pixel-defining layer 19 is formed so that at least one portion of the top surface of the first electrode 118 is not covered.

Next, although not shown in the drawings, the intermediate layer 120 is formed on the first electrode 118, and the second electrode 122 is formed on the intermediate layer 120.

According to the above-described embodiment, two insulating layers namely, the first and second interlayer insulating layers 15 and 16, may be formed between the gate electrode 214, the source electrode 217a, and the drain electrode 217b so that a short-circuit may be effectively prevented from occurring between the gate electrode 214, the source electrode 217, and the drain electrode 217, thereby improving a display quality. Also, a gate wiring may be formed to be thick so that an increase in resistance due to a reduction in a width of the gate wiring may be prevented or reduced, thereby preventing or reducing a delay in signal transmission.

Also, the first contact hole 15b of the first layer insulating layer 15 is formed to have a small size so that a distance between wirings is minimized, thereby easily implementing an organic light-emitting display device having high resolution.

The source electrode 217a and the drain electrode 217b and a distance between other wirings are minimized so as to easily implement an organic light-emitting display device having high resolution. In addition, because the second contact hole 16b of the second interlayer insulating layer 16 is formed to be larger than the first contact hole 15b, electrical characteristics of the thin film transistor TFT may be improved.

The first electrode 118 directly contacts a top surface of the drain electrode 217b (and does not do so via a contact hole), and therefore, a design margin for forming the contact hole is reduced (e.g., the size of the contact hole is reduced), thereby improving an aperture ratio. Also, the first electrode 118 is formed by using a separate etching process than the process for forming other conductive layers, and thus the degree of freedom of selecting a material of the first electrode 118 is increased.

According to some embodiments, an organic light-emitting display device according to one or more embodiments of the present invention and a method of manufacturing the same provide the following effects:

First, two insulating layers are formed between a gate electrode, a source electrode, and a drain electrode so that a short-circuit may be effectively prevented from occurring between wirings, thereby improving a display quality.

Second, a gate wiring may be formed to be thick so that an increase in resistance due to a reduction in a width of the gate wiring may be prevented or reduced, thereby preventing or reducing a delay in signal transmission.

Third, a first contact hole of a first interlayer insulating layer is formed to be small so that a distance between the wirings may be minimized, thereby easily implementing an organic light-emitting display device having high resolution. Also, because a second contact hole of a second interlayer insulating layer is formed to be larger than the first contact hole, electrical characteristics of a thin film transistor are improved.

Fourth, the first electrode directly contacts the drain electrode (and does not do so via a contact hole), and as such, a design margin for forming the contact hole is reduced (e.g., the size of the contact hole may be reduced), thereby improving an aperture ratio.

Fifth, the first electrode is formed by using a separate etching process than the process for forming other conductive layers, and thus the degree of freedom of selecting a material of the first electrode is increased.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:
1. An organic light-emitting display device comprising:
   a substrate;
   an active layer on the substrate;
   a gate electrode insulated from the active layer and overlapping the active layer;
   a source electrode comprising a first source electrode layer connected to the active layer, and a second source electrode layer connected to the first source electrode layer;
   a drain electrode comprising a first drain electrode layer connected to the active layer, and a second drain electrode layer connected to the first drain electrode layer;
   a first interlayer insulating layer on the gate electrode;
   a second interlayer insulating layer on the first interlayer insulating layer;
   a first electrode that is directly connected to a top surface of the source electrode or the drain electrode;
   an intermediate layer on the first electrode and comprising an organic emission layer; and
   a second electrode on the intermediate layer,
   wherein each of the first source electrode layer and the first drain electrode layer is connected to the active layer through a plurality of first contact holes in the first interlayer insulating layer, and
   each of the second source electrode layer and the second drain electrode layer is connected to the plurality of first contact holes through a second contact hole in the second interlayer insulating layer,
   wherein the substrate comprises a capacitor area, and at least one capacitor comprising a first capacitor electrode and a second capacitor electrode is on the capacitor area, and
   wherein the first capacitor electrode and the active layer are in the same layer, and the second capacitor electrode and the gate electrode are in the same layer.

2. The organic light-emitting display device of claim 1, wherein each of the plurality of first contact holes is smaller than the second contact hole.

3. The organic light-emitting display device of claim 1, wherein the first interlayer insulating layer comprises an inorganic material, and the second interlayer insulating layer comprises an organic material.

4. The organic light-emitting display device of claim 1, wherein a top surface of the second interlayer insulating layer comprises a planarized surface.

5. The organic light-emitting display device of claim 1, wherein the first electrode is in an opening in the second interlayer insulating layer, and the first electrode is connected to the source electrode or the drain electrode along a side surface of the opening.

6. The organic light-emitting display device of claim 1, wherein an opening in the second interlayer insulating layer is at an inner side of an opening in the first interlayer insulating layer.

7. The organic light-emitting display device of claim 1, wherein a gate insulating layer is between the active layer and the gate electrode, and an opening in the gate insulating layer and an opening in the first interlayer insulating layer have the same etched surface.

8. The organic light-emitting display device of claim 1, wherein the first electrode comprises at least one of indium tin oxide (ITO), indium zinc oxide (IZO), zinc oxide (ZnO), In2O3, indium gallium oxide (IGO), or Al-doped zinc oxide (AZO).

9. The organic light-emitting display device of claim 8, wherein the first electrode further comprises a semi-permeable metal layer.

10. The organic light-emitting display device of claim 1, wherein the second electrode is a reflective electrode.

11. The organic light-emitting display device of claim 1, wherein the first electrode is between the substrate and the gate electrode.

12. A method of manufacturing an organic light-emitting display device, the method comprising:
    forming an active layer on a substrate;
    forming a gate electrode that is insulated from the active layer and overlaps with the active layer;
    forming a source electrode comprising a first source electrode layer connected to the active layer, and a second source electrode layer connected to the first source electrode layer, the second source electrode layer being larger than the first source electrode layer;
    forming a drain electrode comprising a first drain electrode layer connected to the active layer, and a second drain electrode layer connected to the first drain electrode layer, the second drain electrode layer being larger than the first drain electrode layer;
    forming a first electrode to be directly connected to a top surface of the source electrode or the drain electrode;
    forming an intermediate layer on the first electrode, the intermediate layer comprising an organic emission layer; and
    forming a second electrode on the intermediate layer,
    wherein each of the first source electrode layer and the first drain electrode layer is connected to the active layer through a plurality of first contact holes in a first interlayer insulating layer,
    each of the second source electrode layer and the second drain electrode layer is connected to the plurality of first contact holes through one second contact hole in a second interlayer insulating layer,
    the first interlayer insulating layer has the plurality of first contact holes,
    the second interlayer insulating layer has the second contact hole,
    the second contact hole overlaps the plurality of first contact holes, and
    each of the first contact holes is smaller than the second contact hole.

13. The method of claim 12, wherein the forming of the source electrode and the forming of the drain electrode comprises concurrently forming the first source electrode layer, the first drain electrode layer, the second source electrode layer, and the second drain electrode layer after forming the first interlayer insulating layer and the second interlayer insulating layer.

14. The method of claim 12, wherein the forming of the second interlayer insulating layer comprises forming an opening in the second interlayer insulating layer, wherein the first electrode is in the opening.

15. The method of claim 14, wherein the forming of the first electrode comprises forming the first electrode to be connected to a top surface of the source electrode or the drain electrode along a side surface of the opening in the second interlayer insulating layer.

16. The method of claim 12, wherein the forming of the first interlayer insulating layer comprises forming an opening in the first interlayer insulating layer, and the forming of the second interlayer insulating layer comprises forming an opening in the second interlayer insulating layer, the opening in the second interlayer insulating layer being smaller than the opening formed in the first interlayer insulating layer.

* * * * *